(12) United States Patent
Niewiera

(10) Patent No.: US 9,169,150 B2
(45) Date of Patent: Oct. 27, 2015

(54) DEVICE AND METHOD FOR TRIMMING A FLOAT GLASS STRIP THAT HAS A NORMAL OR STRUCTURED SURFACE

(75) Inventor: Wolfgang Niewiera, Donauwoerth (DE)

(73) Assignee: Grenzebach Maschinenbau GmbH, Asbach-Baeumenheim (DE)

(\*) Notice: Subject to any disclaimer, the term of this patent is extended or adjusted under 35 U.S.C. 154(b) by 0 days.

(21) Appl. No.: 14/005,968

(22) PCT Filed: Apr. 2, 2012

(86) PCT No.: PCT/DE2012/000355
§ 371 (c)(1),
(2), (4) Date: Sep. 18, 2013

(87) PCT Pub. No.: WO2012/136193
PCT Pub. Date: Oct. 11, 2012

(65) Prior Publication Data
US 2014/0013802 A1    Jan. 16, 2014

(30) Foreign Application Priority Data

Apr. 6, 2011 (DE) .......................... 10 2011 016 210

(51) Int. Cl.
  *C03B 33/03* (2006.01)
  *C03B 33/023* (2006.01)
  *C03B 33/033* (2006.01)
  *C03B 33/037* (2006.01)

(52) U.S. Cl.
  CPC .............. *C03B 33/03* (2013.01); *C03B 33/0235* (2013.01); *C03B 33/033* (2013.01); *C03B 33/037* (2013.01)

(58) Field of Classification Search
USPC ............................... 65/29.11, 29.12, 163, 176
See application file for complete search history.

(56) References Cited

U.S. PATENT DOCUMENTS

| 3,779,437 | A | * | 12/1973 | Yamamoto et al. | .......... 225/96.5 |
| 4,049,167 | A | * | 9/1977 | Guissard | ........................... 225/2 |
| 4,749,167 | A | * | 6/1988 | Gottschall | ....................... 251/65 |
| 4,828,900 | A | * | 5/1989 | Mouly | .......................... 428/192 |
| 5,054,355 | A | * | 10/1991 | Tisse et al. | ..................... 83/879 |
| 6,679,085 | B1 | | 1/2004 | Singer | |

(Continued)

FOREIGN PATENT DOCUMENTS

| EP | 2397447 | 12/2011 |
| JP | 2010007953 | 1/2010 |

(Continued)

*Primary Examiner* — Mark Halpern
(74) *Attorney, Agent, or Firm* — Duane Morris LLP; J. Rodman Steele, Jr.; Gregory M. Lefkowitz

(57) ABSTRACT

The invention relates to a device and a method for trimming a float glass strip that has a normal or structured surface, comprising the following features: a) a cutting slide having a lower running rail and a cutting slide having an upper running rail for a bottom cut for a structured surface or a top cut for a normal surface, wherein both running rails are arranged at an acute angle to the running direction of the glass strip and this angled position can be adjusted; b) a number of counter pressure rollers for the lower cutting slide; c) a hold-down apparatus (6) having a breaking roller (20) and a front hold-down roller (21) for a bottom cut; d) a hold-down apparatus (15) having a breaking roller (14) and a rear hold-down roller (18) for a top cut; e) apparatuses (10, 11, 12) for measuring the advance speed of the glass strip (11) and the current length of the glass strip.

8 Claims, 5 Drawing Sheets

(56) References Cited

U.S. PATENT DOCUMENTS

| | | |
|---|---|---|
| 8,430,289 B2 | 4/2013 | John |
| 2008/0264994 A1 | 10/2008 | Herve et al. |

FOREIGN PATENT DOCUMENTS

| | | |
|---|---|---|
| KR | 1020050029725 | 9/2007 |
| WO | 2010007953 | 1/2010 |

\* cited by examiner

DEVICE AND METHOD FOR TRIMMING A FLOAT GLASS STRIP THAT HAS A NORMAL OR STRUCTURED SURFACE

CROSS-REFERENCE TO RELATED APPLICATIONS

This application is a §371 national stage entry of International Application No. PCT/DE2012/000355, filed Apr. 2, 2012, which claims priority to German Patent Application No. 10 2011 016 210.0 filed Apr. 6, 2011, the entire contents of which are incorporated herein by reference.

Float glass is usually manufactured by continuously pouring the molten glass onto a tin bath, which is heated in an elongate tub, and the thus resulting glass strip.

The subsequent making up of float glass is carried out by longitudinal cutting and transverse cutting of the glass strip which emerges from the float glass production at a particular feed rate. The longitudinal cutting in this case is effected by longitudinal cutting wheels which are located in corresponding positions above the glass strip. The transverse cutting, or cutting to length, occurs with the aid of cutting bridges and transverse cutting wheels which are moved transversely on said cutting bridges across the glass strip. The glass panels to be cut are usually cut from float glass having a length of 6 m and a width of more than 3 m.

In the shaping of the glass strip, usually a somewhat different distribution of thickness is formed on the edges than in the center or the later net useable area as a result of surface tensions, temperature gradients and viscosity gradients and on account of mechanical conveying tools, for example rollers. The edge region on both sides of the glass strip here is referred to as the border region.

The object forming the basis of DE 102 37 478 B4 is thus to carry out the usual method for cutting a glass strip in respect of the applied cutting force in such a manner that the border region and also the net region are sufficiently scored in order to achieve a correct fracture process and simultaneously a premature breaking apart of the glass strip.

According to claim 1 of said document, the solution to this problem proceeds from a method for cutting a continuous glass strip in the manufacturing of flat glass, which has an inhomogeneous distribution of thickness across its width, in which further a cutting tool is moved across the width of the glass strip with a cutting force, which is predetermined by a control unit, creating a notch at an angle in relation to the conveying direction, and the glass strip is subsequently mechanically fractured along the notch. In such a method, protection is claimed for the cutting force to be actively predetermined by the control unit in a manner adapted to the thickness of the glass.

In another technical field, glass having particular optical functions, for example glass having a defined precise surface structuring, is often demanded. Such a structuring is inter alia demanded for display screens for flat screen monitors, referred to as channel plates.

DE 198 47 549 C1 discloses a shaping tool having a structured surface for creating structures on glass for manufacturing such display screens and the use of said shaping tool in the structuring of channel plates. This known shaping tool has a roll cylinder which consists of a metallic hollow cylinder on the outer sleeve of which a shaping sheet, which has recesses according to the negative of the glass structures to be applied, is attached in close two-dimensional contact. Furthermore, said tool has a shaft for the continuous drive of the roll cylinder, said shaft extending through the metallic hollow cylinder, wherein, level with the end face of the metallic hollow cylinder, two dogs which are in operative engagement in a form fitting manner with the hollow cylinder are fixedly attached to the shaft. The known tool further has an electric heating, which is located in an electrically isolated manner between the shaft and the metallic hollow cylinder and has an additional thermal insulation in relation to the shaft.

In the meantime, further possibilities for manufacturing glass having a structured surface on a float glass line have emerged; however, no printed documentation pertaining to them is available.

If there is now the requirement for one and the same float glass line to alternatingly produce and cut to length glass having a smooth surface and glass having a structured surface, different installations are required for manufacturing glass having such differences. However, if an existing installation is used in this event, said installation, for example when changing over from normal glass to glass having a structured surface, needs to be equipped with a corresponding additional unit. Moreover, the old molten glass has to first cool down and the melting process then has to be started over again. In addition, glass having a structured surface has to be cut in a different manner than normal float glass.

The invention is thus based on the object of providing a device and a corresponding method which enable cutting to length of a float glass strip during the ongoing operation, irrespective of the structure of the glass surface.

This object is achieved by the device as claimed in claim 1 and the method as claimed in claim 6.

The solution substantially consists of a device being provided for the cutting to length or cutting of the glass strip overhead and simultaneously underneath.

The device according to the invention is described in more detail in the following.

In the drawings, in detail:

Figure 1:
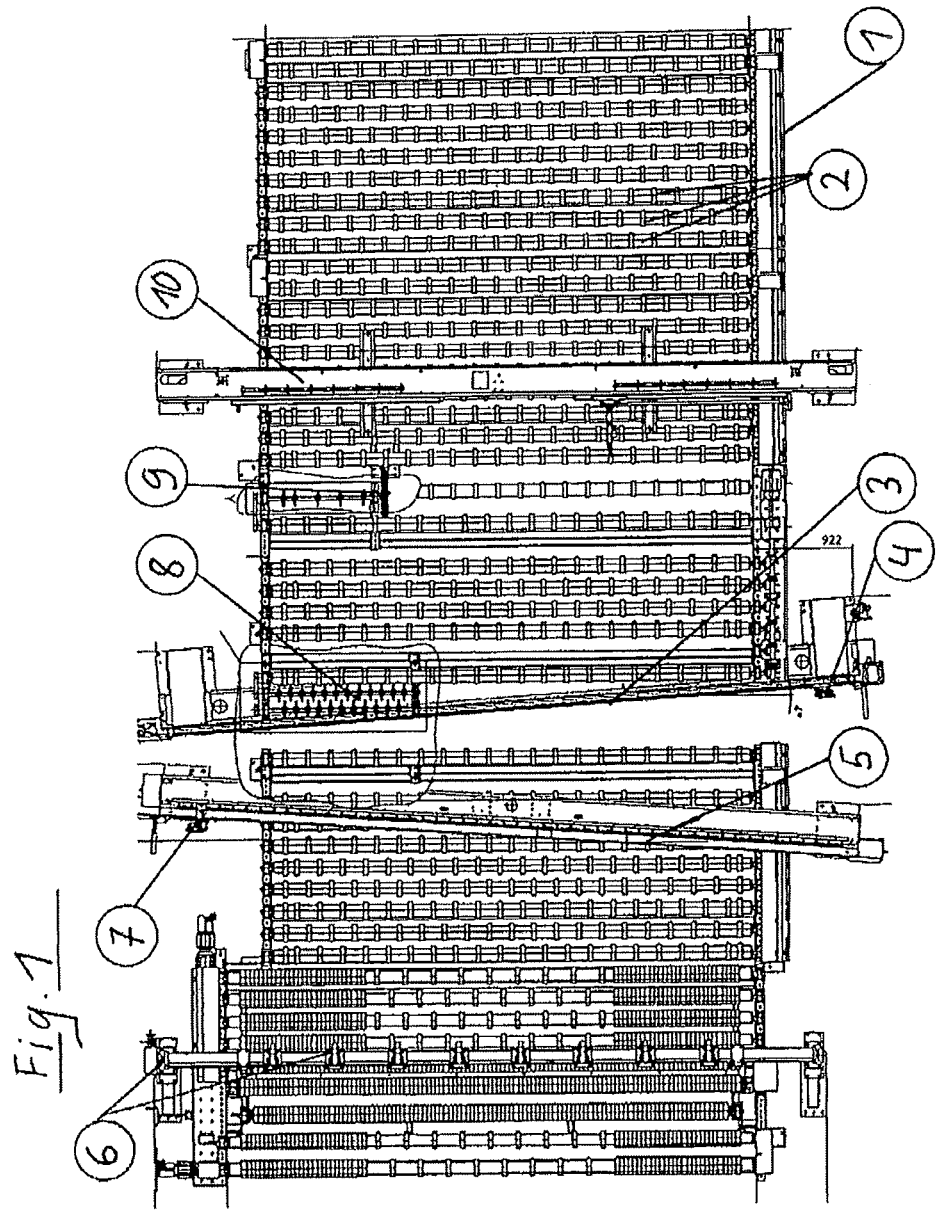
FIG. 1 shows a plan view of a device according to the invention.

In FIG. 1, a plan view of a device according to the invention is shown. The conveying rollers 2 are mounted in the basic frame 1, the glass strip 11 in each case approaching the measuring bridge 10 from the right-hand side of FIG. 1. In the right-hand central region of the shown plan view, the structured float glass is cut from below by means of the lower cutting carriage 4 which runs in the running rail 3. Since in this operation, which occurs counter to gravity and raises the glass strip 11, a defined counterpressure is required, the counterpressure rollers 8 shown run along with the cutting carriage 4 on the upper side of the glass strip 11. In order to enable a cut which runs perpendicularly, the running rail 3 extends obliquely in relation to the conveying direction of the glass strip 11, in order to compensate for the movement of the glass strip 11 during the cutting process. By means of a measuring wheel 9 which is attached on the side, speed and length of the glass strip 11 to be trimmed are measured. The data thus determined is processed in the measuring bridge 10 and used for controlling the lower cutting carriage 4. In order to achieve a desired cut which runs perpendicularly to the conveying direction of the glass strip 11, the speed of the cutting carriage 4 has to be increased in the case of a glass strip 11 that moves faster, and vice versa. Since not only the speed of the cutting carriage 4 but also the inclination of the running rail 3 plays a part in the cutting process, as the blade on the respective cutting carriage cannot move as fast as desired, the angle formed by the running rail 3 transversely to the conveying direction of the glass strip 11 is also adapted to the speed of the glass strip 11.

The counterpressure rollers 8 here run across the structured surface of the glass strip 11. Since the texture of the structured surface can vary considerably, the counterpressure by the counterpressure rollers 8 must occur such that they do not cause a rattling vibration of the glass strip 11 caused by the depth of the roughness of the structure in each case during the rolling action and compromise the continuous and consistently deep engagement of the blade or the cutting wheel on the cutting carriage 4. This is because on account of such a rattling vibration the cutting carriage could likewise run along in a vibrating manner on the glass strip 11 and prevent a smooth, consistently deep cut. For this reason, the counterpressure rollers 8 are preferably configured in the manner of a pneumatic vehicle tire. The risk of a rattling vibration is estimated based on experience values by means of a sensor which determines the depth of the roughness of the surface of the glass strip 11, and the air pressure in the counterpressure rollers 8 is automatically adjusted such that the cutting carriage 4 can reliably fulfill its function. In this manner, the service life of the cutting wheel of the cutting carriage 4 is also extended.

In the left-hand region of the shown plan view, in the case of an unstructured normal surface, a glass strip 11 is cut from above by the upper cutting carriage 7 which runs on the running rail 5.

The gap which is evident in FIG. 1 between the two cutting devices has been kept vacant for the purpose of an enhanced illustration. This gap is normally bridged by means of conveying rollers 2. The difference in inclination of the running rails 3 and 5 is also not included in this illustration. In this manner it should also be clarified that the running rails 3 and 5 can be adjusted at different inclinations from one another. The illustration of corresponding servomotors or adjustment arrangements has been dispensed with for reasons of clarity.

Figure 5:
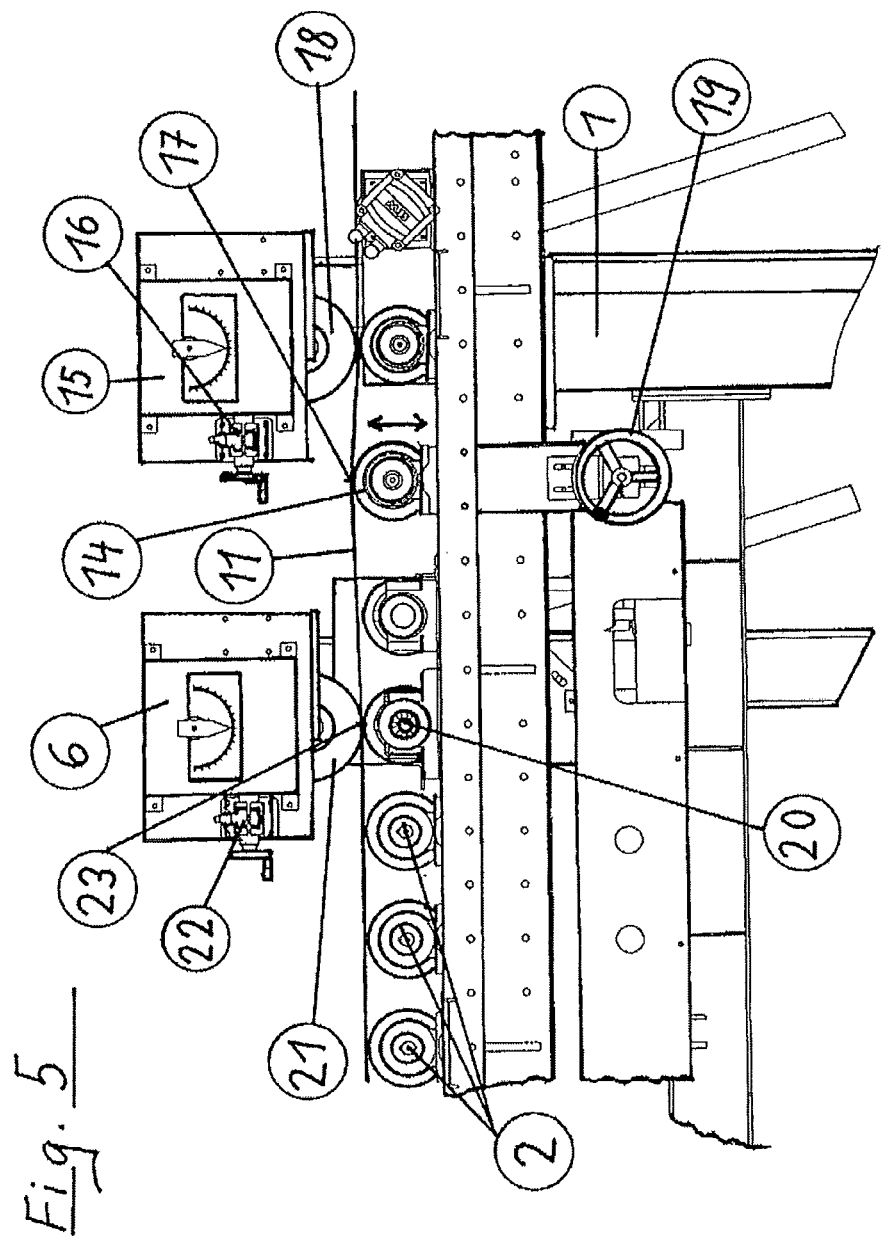
FIG. 5 shows a detailed lateral view of the fracture region of both cutting methods.

The front hold-down unit 6 which follows in the process direction represents the connection to the lateral view of the fracture region according to FIG. 5.

Figure 2:
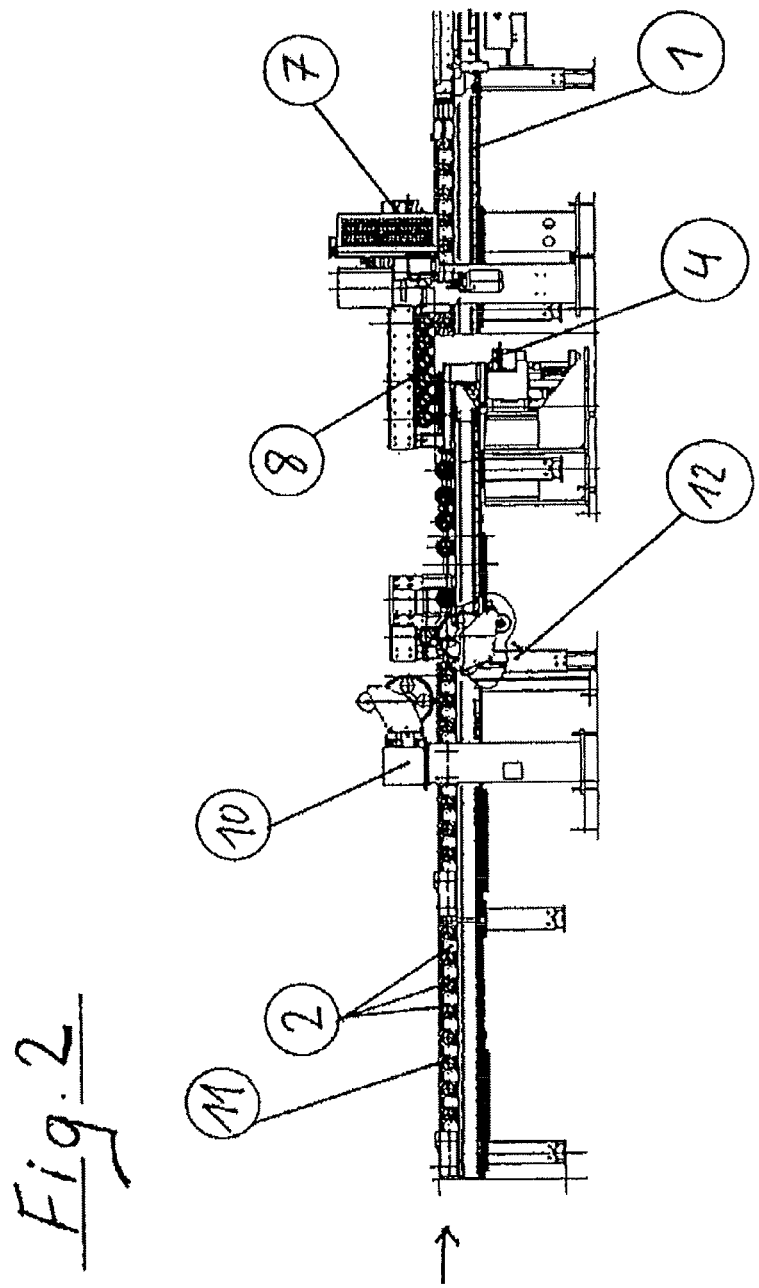
FIG. 2 shows a lateral view of the device according to the invention.

In FIG. 2 a lateral view of the device according to the invention is visible. The glass strip 11 here, coming from the left-hand side, runs on the conveying rollers 2 in the direction of the lower cutting carriage 4, which has the counterpressure rollers 8 assigned to it. Downstream, the measuring bridge 10 follows. Subsequently, the measuring unit 12 follows where, in the event of a float glass having a structured surface, the detection of the relevant data below the structured surface occurs.

In this illustration, the upper cutting carriage 7, which is connected to the basic frame 1, is further illustrated.

Figure 3:
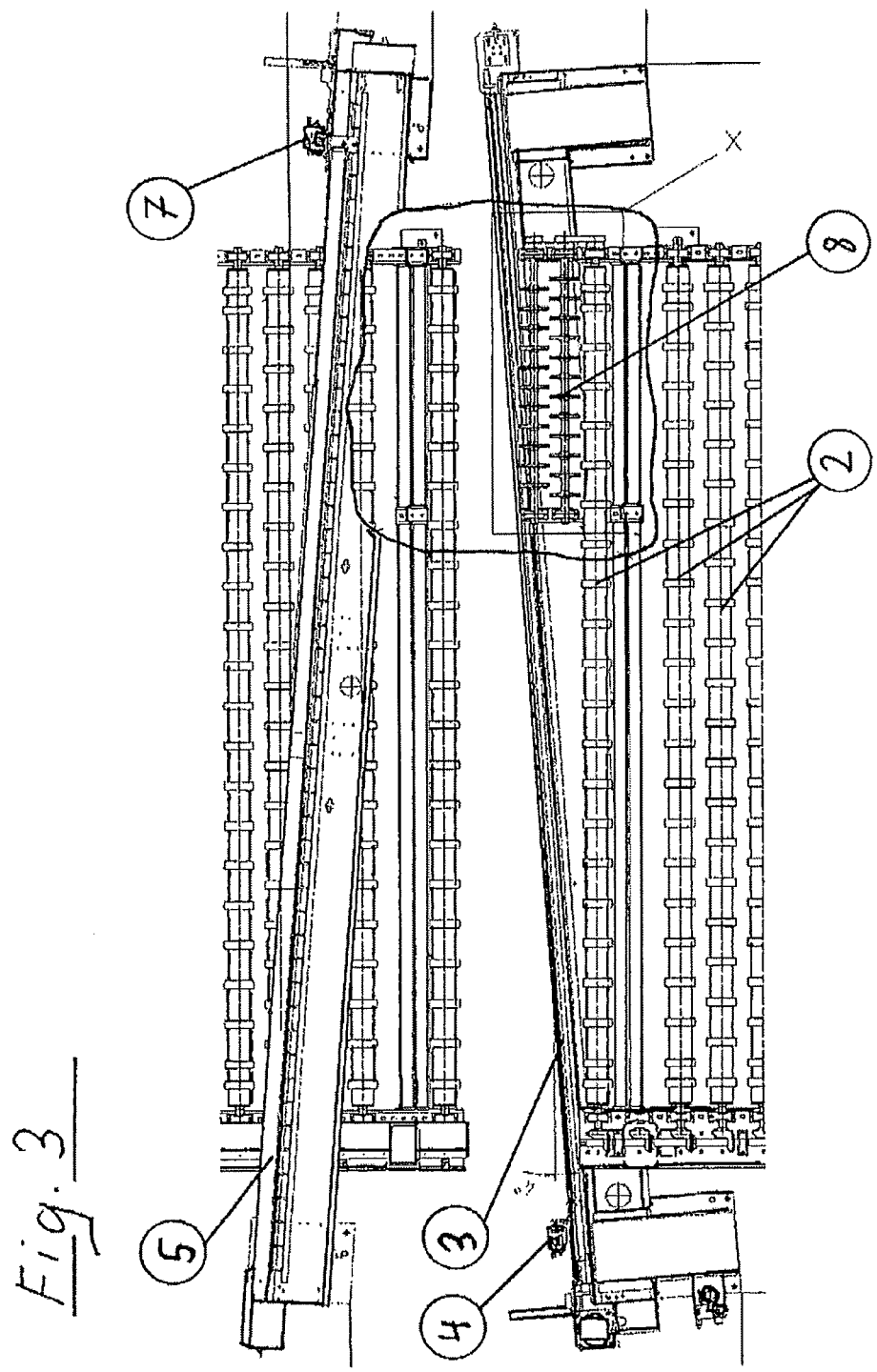
FIG. 3 shows a detailed plan view of the running rails.

In FIG. 3, a detailed plan view of the running rails, as they are shown in FIG. 1, follows. From bottom to top, being the flow direction of the glass strip 11 here, the conveying rollers 2 and the running rail 3 having the lower cutting carriage 4 and its counterpressure rollers 8 can be identified. In the upper region of the image, the running rail 5 and the associated upper cutting carriage 7 follow.

Figure 4:
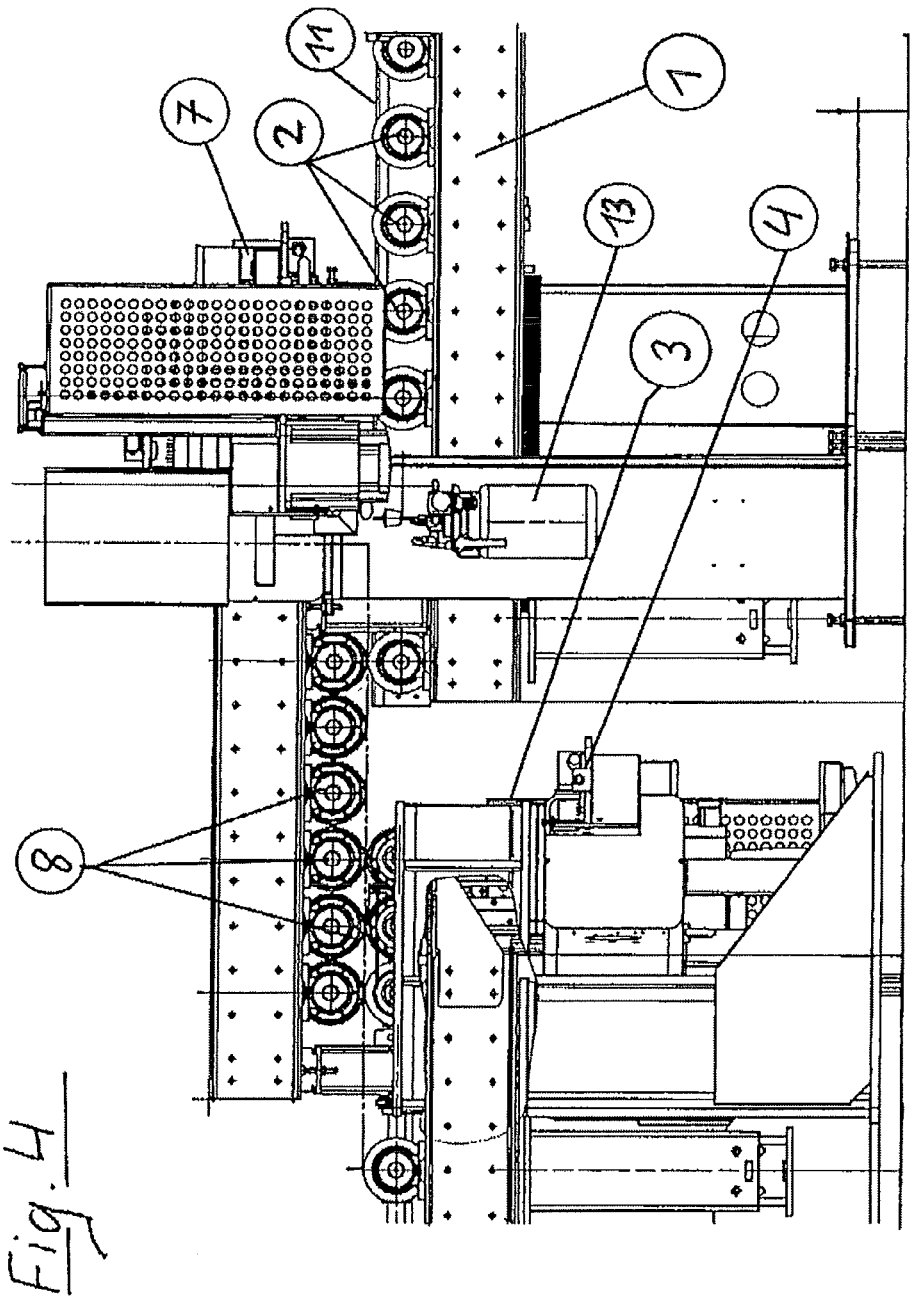
FIG. 4 shows a detailed lateral view of the two cutting regions.

The detailed lateral view of the two cutting regions shown in FIG. 4 discloses further details. The flow direction of the glass strip 11 here is from left to right. Additionally to the lower running rail 3 having the lower cutting carriage 4 and the six counterpressure rollers 8, the supply unit 13 for feeding cutting oil is also identifiable here. On the right-hand side, the track rollers 2 with the glass strip 11 resting on top and the upper cutting carriage 7 with its fastening in the basic frame 1 are drawn in an enlarged manner.

FIG. 5 shows a detailed lateral view of the fracture region of both cutting methods. Here the connection is identifiable to the illustration of FIG. 1 via the front hold-down unit 6, which is shown on the left-hand side in FIG. 1 and also appears on the left-hand side in FIG. 5, but is visible from the side in such a manner that the glass strip 11 runs in the flow direction from left to right. In the upper region of the image here, the front hold-down unit 6 of the glass fracturing unit and the rear hold-down unit 15 of the glass fracturing unit are to be seen in interaction, wherein for reasons of illustration both hold-down units are shown drawn somewhat more closely together than would correspond to the spacial conditions in practice. The front hold-down unit 6 performs the fracturing of the glass strip 11 running on the conveying rollers 2 at the position of an undercut here by means of the front hold-down roller 21 in conjunction with the fracture roller 20, if said glass strip 11 has a structured surface and has been previously scored by means of the lower cutting carriage 4 at the required position. The resulting location of fracture of such an undercut is indicated by the designation 23. The front hold-down roller 21 here presses from above onto the structured surface, as in the case of the counterpressure rollers 8. For this reason, a configuration in the manner of a pneumatic vehicle tire is likewise preferably also provided for the front hold-down roller 21, as described in FIG. 1 for the counterpressure rollers 8.

If the glass strip 11 is unstructured float glass, the front hold-down roller 21 remains in an upper position, so that the glass strip 11 can proceed unencumbered in the direction of the fracture roller 14 for an overcut. Once the glass strip 11 is at the location 17 on the topmost point of the fracture roller 14, the rear hold-down unit 15 swings into action by means of the hold-down roller 18 and presses in such a manner onto the glass strip 11 that this breaks off at the desired location 17. The further conveyance in both cases occurs via further conveying rollers 2 (not shown) up to a diverter point at which the cut-off glass strips 11 are then sorted according to their various types.

As can be gathered from FIG. 5, possibilities in each case exist for the fine adjustment of the hold-down unit 6, the fracture roller 14 and the hold-down unit 15, said fine adjustment possibilities having the corresponding designations 22, 19 and 16.

The mentioned fine adjustments relate to the glass thickness of a glass strip 11, the composition of the molten glass used and, if applicable, the type of structure as subjects of the main parameters. In a particular embodiment, these parameters are detected by corresponding sensors and by means of set point values, which are based on experience values or calculated values, are used for the automatic fine adjustment 16, 19 and/or 22.

As field of application for float glass having structured surfaces, reference is made in particular to photovoltaic elements.

The control of the complex movement processes and the signal processing of the used sensors require a special control program.

LIST OF REFERENCE SIGNS

1 Basic frame
2 Conveying rollers
3 Running rail for lower cutting carriage 4
4 Lower cutting carriage
5 Running rail for upper cutting carriage 7

6 Front hold-down unit of the glass fracturing unit
7 Upper cutting carriage
8 Counterpressure rollers for the lower cutting carriage 4
9 Measuring wheel (lengths and speed)
10 Measuring bridge
11 Glass strip
12 Lower measuring unit
13 Supply unit for cutting oil
14 Fracture roller for an overcut
15 Rear hold-down unit of the glass fracturing unit
16 Fine adjustment of the rear hold-down unit 15
17 Location of fracture of an overcut
18 Rear hold-down roller
19 Fine adjustment of the fracture roller 14 for an overcut
20 Fracture roller for an undercut
21 Front hold-down roller
22 Fine adjustment of the hold-down unit 6
23 Location of fracture of an undercut

The invention claimed is:

1. A device for cutting to length a float glass strip having a normal or structured surface, having the following features:
   a) i) a lower cutting carriage (4) having a lower running rail (3) below a plurality of conveying rollers (2) adapted for supporting a glass strip (11), said lower cutting carriage (4) for making an undercut in the case of a structured surface, and
   ii) an upper cutting carriage (7) having an upper running rail (5) above the plurality of conveying rollers (2), said upper cutting carriage 7 for making an overcut in the case of a normal surface, wherein the lower and upper running rails (3, 5) are arranged obliquely at acute angles in relation to the conveying direction of the glass strip (11) and each inclination is adjustable,
   b) a number of counterpressure rollers (8) above the conveying rollers, adapted to oppose a force exerted by the lower cutting carriage (4) when making an undercut in the glass strip (11),
   c) a first hold-down unit (6) having a first fracture roller (20) and a front hold-down roller (21) for breaking the glass strip (11) along an undercut produced by the lower cutting carriage (4),
   d) a second hold-down unit (15) having a second fracture roller (14) and a rear hold-down roller (18) for an overcut produced by the upper cutting carriage (7), and
   e) units (10, 11, 12) for measuring the advancing speed of the glass strip (11) and its current length.

2. The device as claimed in claim 1, wherein pressure wheels (8, 18, 21) which come into contact with the structured surface of a glass strip (11) are inflatable, wherein an air pressure of the pressure wheels is (8, 18, 21) automatically adjusted to the depth of the roughness of the structure.

3. The device as claimed in claim 1, wherein the adjustment of the inclination of the lower and upper running rails (3, 5) takes place depending on the advancing speed of the glass strip (11).

4. The device as claimed in claim 1, wherein the hold-down unit (6) and/or the fracture roller (14) and/or the hold-down unit (15) in each case have position adjustments (22, 19, 16) which are adjusted depending on a thickness of the glass strip (11) and/or the composition of the molten glass and/or the type of structure of the surface of the glass strip (11) as parameters.

5. The device as claimed in claim 4, wherein the mentioned parameters in part or collectively are detected by corresponding sensors of a measuring bridge positioned upstream of the upper and lower running rails (5, 3) and by means of set point values, which are based on experience values or calculated values, are used for the automatic fine adjustment.

6. The device as claimed in claim 1, wherein the counterpressure rollers (8) are configured in the manner of pneumatic vehicle tires, the air pressure being automatically adjusted to the depth of the roughness of the structure.

7. The device as claimed in claim 1, further comprising a measuring unit (12) for detecting whether the glass strip (11) is structured or unstructured, wherein (A) when the glass strip (11) is structured, the lower cutting carriage (4) and the first hold-down unit (6) is activated, and (B) when the glass strip (11) is unstructured, the upper cutting carriage (7) and the second hold-down unit (15) are activated.

8. The device as claimed in claim 1, wherein each inclination is independently adjustable.

* * * * *